(12) United States Patent
Yamashita et al.

(10) Patent No.: US 8,536,761 B2
(45) Date of Patent: Sep. 17, 2013

(54) PIEZOELECTRIC RESONATOR HAVING MESA TYPE PIEZOELECTRIC VIBRATING ELEMENT

(75) Inventors: Go Yamashita, Ina (JP); Kenji Komine, Chigasaki (JP); Shiro Murakami, Shiojiri (JP)

(73) Assignee: Seiko Epson Corporation (JP)

( * ) Notice: Subject to any disclaimer, the term of this patent is extended or adjusted under 35 U.S.C. 154(b) by 436 days.

(21) Appl. No.: 12/909,254

(22) Filed: Oct. 21, 2010

(65) Prior Publication Data

US 2011/0095657 A1 Apr. 28, 2011

(30) Foreign Application Priority Data

Oct. 27, 2009 (JP) ................. 2009-246902

(51) Int. Cl.
*H01L 41/08* (2006.01)
(52) U.S. Cl.
USPC ............ 310/321; 310/320; 310/322; 310/333
(58) Field of Classification Search
USPC ........................................ 310/320–322, 333
See application file for complete search history.

(56) References Cited

U.S. PATENT DOCUMENTS

| | | | | |
|---|---|---|---|---|
| 3,891,872 | A | * | 6/1975 | Nagata et al. ................. 310/320 |
| 4,583,017 | A | * | 4/1986 | Nakamura et al. ............ 310/321 |
| 5,422,532 | A | * | 6/1995 | Inoue et al. ................... 310/326 |
| 5,770,799 | A | * | 6/1998 | Nakamura et al. ......... 73/514.34 |
| 6,518,688 | B1 | * | 2/2003 | Sasaki ........................... 310/320 |
| 7,745,979 | B2 | * | 6/2010 | Tsuchido ...................... 310/365 |
| 7,795,781 | B2 | * | 9/2010 | Barber et al. ................. 310/320 |
| 7,847,649 | B2 | * | 12/2010 | Van Beek et al. ............. 331/154 |
| 8,242,664 | B2 | * | 8/2012 | Onoe ............................ 310/320 |

FOREIGN PATENT DOCUMENTS

| | | | |
|---|---|---|---|
| JP | 61065510 A | * | 4/1986 |
| JP | 10-308645 | | 11/1998 |
| JP | 2006-340023 | | 12/2006 |
| JP | 2008-263387 | | 10/2008 |
| JP | 2008-306594 | | 12/2008 |
| JP | 2009-065270 | | 3/2009 |

* cited by examiner

*Primary Examiner* — J. San Martin
(74) *Attorney, Agent, or Firm* — Harness, Dickey & Pierce, P.L.C.

(57) ABSTRACT

A piezoelectric resonator includes: a piezoelectric plate having a vibrating portion surrounded by a peripheral portion; and an excitation electrode on the piezoelectric plate, wherein long sides of the vibrating portion and excitation electrode are parallel to a piezoelectric plate long side. Assuming a piezoelectric plate long side length X, a vibrating portion thickness t, a vibrating portion long side length Mx, an excitation electrode long side length Ex, and a piezoelectric plate flexure vibration wavelength $\lambda$, $\lambda/2=(1.332/f)-0.0024$ (piezoelectric resonator resonance frequency f), $(Mx-Ex)/2=\lambda/2$, $Mx/2=\{(A/2)+(1/4)\}\lambda$ (where, A is a positive integer), and $X \geq 20t$. A protruding portion is disposed on a vibrating portion extension line and parallel to a vibrating portion short side. Assuming a protruding portion length Dx, $Dx=(\lambda/2) \times m$ (where, m is a positive integer). Assuming a distance Sx between the vibrating and protruding portions, $Sx=(\lambda/2) \times n \pm 0.1\lambda$ (where, n is a positive integer).

6 Claims, 7 Drawing Sheets

FREQUENCY : 24MHz
λ/2 : 0.053
X : 1.375
Md : 20%
DISTANCE BETWEEN MESA END
AND PROTRUDING PORTION :
0.082 (λ/2 × 1.535)
PROTRUDING PORTION WIDTH :
0.052 (λ/2 × 0.97)

FREQUENCY : 24MHz
λ/2 : 0.053
X : 1.375
Md : 20%
DISTANCE BETWEEN MESA END
AND PROTRUDING PORTION :
0.092 (λ/2 × 1.723)
PROTRUDING PORTION WIDTH :
0.052 (λ/2 × 0.97)

FREQUENCY : 24MHz
λ/2 : 0.053
X : 1.375
Md : 20%
DISTANCE BETWEEN MESA END
AND PROTRUDING PORTION :
0.102 (λ/2 × 1.911)
PROTRUDING PORTION WIDTH :
0.052 (λ/2 × 0.97)

FIG. 5A

FREQUENCY : 26MHz
λ/2 : 0.049
X : 1.030
Md : 20%
DISTANCE BETWEEN MESA END
AND PROTRUDING PORTION :
0.038 (λ/2 × 0.778)
PROTRUDING PORTION WIDTH :
0.048 (λ/2 × 0.983)

FREQUENCY : 26MHz
λ/2 : 0.049
X : 1.030
Md : 20%
DISTANCE BETWEEN MESA END
AND PROTRUDING PORTION :
0.048 (λ/2 × 0.983)
PROTRUDING PORTION WIDTH :
0.048 (λ/2 × 0.983)

FREQUENCY : 26MHz
λ/2 : 0.049
X : 1.030
Md : 20%
DISTANCE BETWEEN MESA END
AND PROTRUDING PORTION :
0.058 (λ/2 × 1.188)
PROTRUDING PORTION WIDTH :
0.048 (λ/2 × 0.983)

FREQUENCY : 24MHz
λ/2 : 0.053
X : 1.375
Md : 20%
DISTANCE BETWEEN MESA END
AND PROTRUDING PORTION :
0.102 (λ/2 × 1.911)
PROTRUDING PORTION WIDTH :
0.052 (λ/2 × 0.97)

FREQUENCY : 24MHz
λ/2 : 0.053
X : 1.375
Md : 15%
DISTANCE BETWEEN MESA END
AND PROTRUDING PORTION :
0.102 (λ/2 × 1.911)
PROTRUDING PORTION WIDTH :
0.052 (λ/2 × 0.97)

PROTRUDING AT BOTH SIDES

PROTRUDING AT SINGLE SIDE

FIG.10

PIEZOELECTRIC RESONATOR HAVING MESA TYPE PIEZOELECTRIC VIBRATING ELEMENT

BACKGROUND

1. Technical Field

The present invention relates to a piezoelectric resonator and in particular, to a piezoelectric resonator having a mesa type piezoelectric vibrating element in which the thickness of the vibrating portion is larger than that of the peripheral portion.

2. Related Art

A mesa type piezoelectric vibrating element is known as a form of a piezoelectric vibrating element which can keep vibration energy therein and which has high productivity, the form being based on a bevel or convex type piezoelectric vibrating element.

In the mesa type piezoelectric vibrating element which has a level difference on the boundary of the vibrating portion and the peripheral portion, however, spurious vibrations, such as flexure vibrations which are unnecessary vibrations, increase with the influence of the level difference. Under such a background, JP-A-2006-340023 discloses a technique of suppressing spurious vibration by optimizing the position of a stepped portion between a vibrating portion and a peripheral portion.

Moreover, JP-A-2008-263387 discloses a technique of suppressing spurious vibration and reducing the CI value by optimizing the size (depth) of a stepped portion in addition to the position of the stepped portion. Moreover, JP-A-2008-306594 discloses a technique of improving the effect of spurious vibration suppression by extending the formation position of an excitation electrode up to a peripheral portion with a small thickness and setting the end of the excitation electrode at the position of a valley of unnecessary vibration.

Thus, for a piezoelectric resonator which adopts a mesa type piezoelectric vibrating element, various techniques have been proposed which suppress flexure vibrations by optimizing the position of the end edge of a mesa portion, that is, a thick portion or the position of an end edge of an excitation electrode on the basis of the relationship with the displacement of flexure vibrations.

However, as disclosed in JP-A-2008-263387, the CI value can be decreased as the rate of digging quantity of the thick portion is increased, but there is no change in the CI value if the rate of digging quantity exceeds a predetermined range. Depending on the situation, a phenomenon occurs in which the CI value increases (deteriorates). In order to solve this phenomenon, JP-A-10-308645 discloses a technique capable of ensuring the digging quantity (increasing the thickness of a stepped portion) and reducing the CI value by forming a mesa portion with multiple steps.

As disclosed in JP-A-2006-340023, JP-A-2008-263387, JP-A-2008-306594, and JP-A-10-308645, the mesa type structure can suppress an unnecessary wave by specifying the position of the stepped portion. Moreover, the CI value of principal vibration can be decreased as the rate of digging quantity of the stepped portion is increased, but deterioration of the CI value, that is, the phenomenon that the CI value increases occurs if the rate of digging quantity exceeds a predetermined value. When manufacturing errors and the like are taken into consideration, it is difficult to practically increase the digging quantity up to the threshold value.

Moreover, in the configuration disclosed in JP-A-10-308645 in which a mesa portion is formed to have multiple steps in order to increase the relative digging quantity, the CI value may be reduced, but the photo process for forming the mesa portion with multiple steps is increased. As a result, there is concern regarding a situation where the productivity decreases markedly.

SUMMARY

An advantage of some aspects of the invention is to provide a piezoelectric resonator which has high productivity and which does not cause an increase in the CI value even if the digging quantity of a mesa portion is set to be larger than that in the related art.

The invention can be embodied as the following forms or application examples.

APPLICATION EXAMPLE 1

This application example of the invention is directed to a piezoelectric resonator including: a piezoelectric plate of which thickness-shear vibration is the principal vibration and which has a vibrating portion that is surrounded by a peripheral portion and has a larger thickness than the peripheral portion; and an excitation electrode disposed on a principal surface of the piezoelectric plate. Both the long side of the vibrating portion and the long side of the excitation electrode are parallel to the long side of the piezoelectric plate. Assuming that the long side length of the piezoelectric plate is X, the thickness of the vibrating portion is t, the long side length of the vibrating portion is Mx, the long side length of the excitation electrode is Ex, and the wavelength of flexure vibrations occurring in the longitudinal direction of the piezoelectric plate is $\lambda$, the following relationship is satisfied.

$\lambda/2 = (1.332/f) - 0.0024$ (where, f is a resonance frequency of a piezoelectric resonator)

$(Mx - Ex)/2 = \lambda/2$ $Mx/2 = \{(A/2) + (1/4)\}\lambda$ (where, A is 1, 2, 3, . . . (positive integer))

$X \geq 20t$

A protruding portion, which is disposed on an extension line of the vibrating portion in the longitudinal direction so as to be parallel to the short side direction of the vibrating portion, is provided.

Assuming that the length of the protruding portion in the displacement direction of the principal vibration is Dx, the relationship of $Dx = (\lambda/2) \times m$ (where, m=1, 2, 3, . . . (positive integer)) is satisfied. Assuming that the distance between the vibrating portion and the protruding portion is Sx, the relationship of $Sx = (\lambda/2) \times n \pm 0.1\lambda$ (where, n=1, 2, 3, . . . (positive integer)) is satisfied.

The piezoelectric resonator with such characteristics has high productivity and does not cause an increase in the CI value even if the digging quantity of a mesa portion is set to be larger than that in the related art.

APPLICATION EXAMPLE 2

According to this application example of the invention, in the piezoelectric resonator according to Application Example of the invention, the excitation electrode is provided to extend from the principal surface of the vibrating portion to the peripheral portion located between the protruding portions and a distance L1 from the vibrating portion to an end edge of the excitation electrode, which is provided to extend up to the peripheral portion, satisfies the relationship of $L1=(\lambda/2)\times p$ (where, $p=1, 2, 3, \ldots$ (positive integer)).

Also in the piezoelectric resonator with such characteristics, the same effects as in the piezoelectric resonator with the characteristics described above can be obtained.

APPLICATION EXAMPLE 3

According to this application example of the invention, in the piezoelectric resonator according to Application Example 1 or 2 of the invention, the piezoelectric plate is a quartz crystal plate and a stepped portion between the vibrating portion and the peripheral portion and a stepped portion between the peripheral portion and the protruding portion each have inclined surfaces. It is preferable that the size of the vibrating portion, the distance from the vibrating portion to the protruding portion, and the size of the protruding portion are set with the middle of the inclined surface as a reference.

Also in the piezoelectric resonator with such characteristics, a reference for setting the size can be acquired even in the case of forming a piezoelectric vibrating element by wet etching.

APPLICATION EXAMPLE 4

According to this application example of the invention, in the piezoelectric resonator according to any one of Application Examples 1 to 3 of the invention, it is preferable that the protruding portion is provided at only one end side of the vibrating portion in the longitudinal direction.

Also in the case of mounting a piezoelectric vibrating element with such characteristics, the same effects as in the piezoelectric resonator with the characteristics described above can be obtained.

APPLICATION EXAMPLE 5

According to this application example of the invention, in the piezoelectric resonator according to any one of Application Examples 1 to 3 of the invention, the short side length of the protruding portion is set to be equal to the short side length of the vibrating portion.

With such a characteristic, it becomes possible to suppress the flexure vibration occurring at least in the range of the vibrating portion.

APPLICATION EXAMPLE 6

According to this application example of the invention, in the piezoelectric resonator according to any one of Application Examples 1 to 5 of the invention, the height of the vibrating portion and a height of the protruding portion from the peripheral portion as a reference are equal.

With such a characteristic, formation of the protruding portion and formation of the vibrating portion can be realized through a one-time etching process. Therefore, since productivity of the piezoelectric vibrating element can be improved, productivity of the piezoelectric resonator itself can also be improved.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
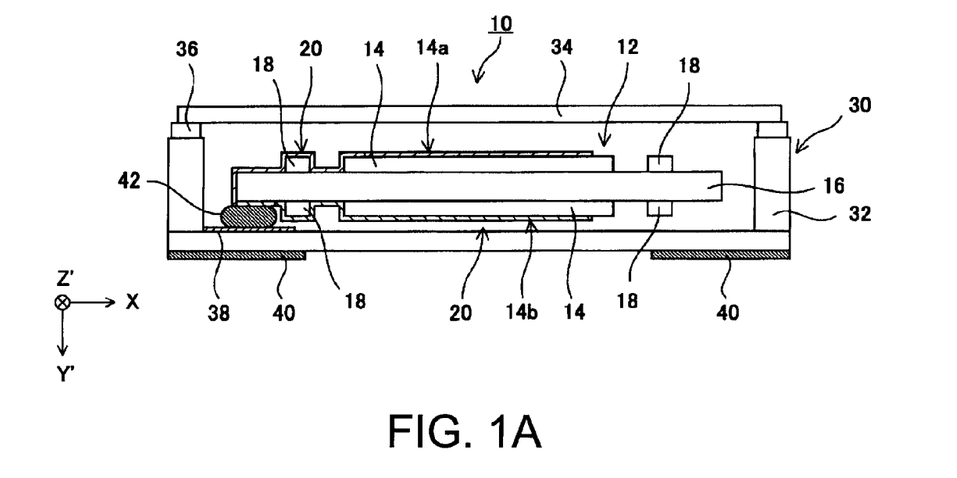
FIGS. 1A and 1B are views showing the configuration of a piezoelectric resonator according to a first embodiment.
Figure 1B:
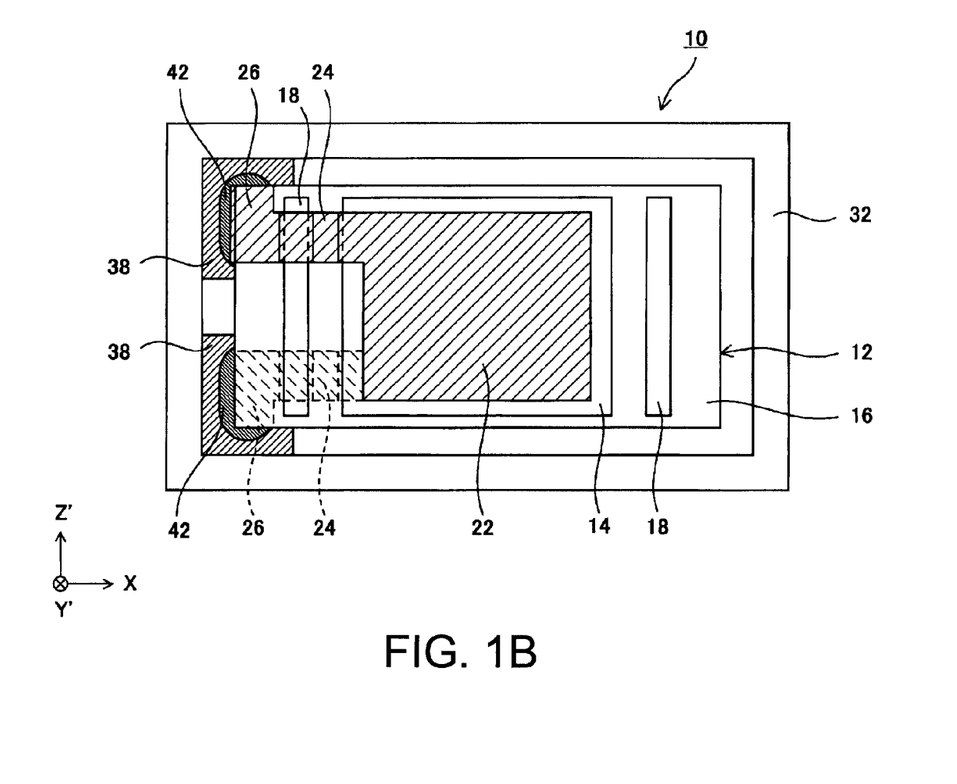

Hereinafter, a piezoelectric resonator according to an embodiment of the invention will be described in detail with reference to the accompanying drawings. First, a piezoelectric resonator according to a first embodiment of the invention will be described with reference to FIGS. 1A and 1B. In addition, FIG. 1A is a view showing the configuration of a piezoelectric resonator when viewed from the front side, and FIG. 1B is a view showing the planar configuration in a state where a lid is removed.

A piezoelectric resonator 10 according to the present embodiment includes a piezoelectric vibrating element 12 and a package 30 as main components. The piezoelectric vibrating element 12 is formed by a quartz crystal plate (piezoelectric plate) which is cut at a cut angle called AT cut or BT cut and which is excited by thickness-shear vibration as main vibration. Moreover, in the quartz crystal plate (piezoelectric vibrating element 12), a side parallel to the X axis of the quartz crystal is set as a long side, a side parallel to the Z' axis of the quartz crystal is set as a short side, and the thickness direction of the quartz crystal plate is assumed to be parallel to the Y' axis.

The piezoelectric vibrating element 12 formed by such a quartz crystal plate includes a thick portion (vibrating portion) 14, a thin portion (peripheral portion) 16, a protruding portion 18, and an electrode film 20. The thick portion 14 is defined by relationship with the thin portion 16, and the thin portion 16 is provided around the thick portion 14. In the present embodiment, a shape unified by overlapping the thick portion 14 with a rectangular flat surface on the rectangular flat plate, which has a long side in a direction parallel to the X axis of the quartz crystal as described above, so that their long sides are parallel to each other is formed by one element plate. In addition, the thick portion 14 is provided on both principal surfaces of the thin portion 16 so as to protrude therefrom.

The protruding portion 18 is provided extending in a direction perpendicular to the direction parallel to the long side of the thick portion 14 provided as described above, that is, in a direction perpendicular to the direction parallel to the displacement direction (X-axis direction in the drawing) of main vibration in the thick portion 14. With the surface of the thin portion 16 as a reference, the thickness of the protruding portion 18 in the Y' direction has the same height (digging quantity) as the thickness of the thick portion 14 in the Y'-axis direction. In addition, the extending direction of the protruding portion 18 is set to be parallel to the width direction (Z'-axis direction in the drawing) of the thick portion 14. In the present embodiment, the length of the protruding portion 18 in the Z'-axis direction is the same as the width of the thick portion 14.

The electrode film 20 has an excitation electrode 22, a lead-out electrode 24 and an input/output electrode 26. In the present embodiment, the excitation electrode 22 is formed on both of one surface 14a and the other surface 14b of the thick portion 14. Moreover, although the shape of the excitation electrode 22 is not particularly limited, the shape of the excitation electrode 22 is similar to the planar shape of the thick portion 14 as shown in FIG. 1B in the present embodiment. The input/output electrode 26 is provided on the other surface of one end (called a base side end) of the thin portion 16 in the longitudinal direction. The lead-out electrode 24 is lead out so that the excitation electrode 22, which is formed on the one surface and the other surface of the thick portion 14, and the input/output electrode 26, which is formed on the other surface at the base side end of the thin portion 16, are electrically connected to each other.

In the piezoelectric vibrating element 12 with such a basic configuration, the wavelength λ of flexure vibration which is an unnecessary wave is decided by the plate thickness t (mm) of the thick portion 14 formed as a vibrating portion. Here, the relationship between the plate thickness t (mm) of the thick portion 14 and the frequency f (MHz) of thickness-shear vibration, which is principal vibration of the piezoelectric vibrating element 12, may be expressed by Expression 1 given below.

$$f = k/t \qquad \text{[Expression 1]}$$

In addition, a frequency constant k is set to 1.670 MHz·mm when the quartz crystal plate is AT cut and 2.560 MHz·mm when the quartz crystal plate is BT cut. Moreover, if the amount of frequency reduction by an electrode is taken into consideration, Expression 2 is satisfied, so that the relationship between the wavelength λ (mm) of flexure vibration and the plate thickness t (mm) of the thick portion 14 can be expressed.

$$\lambda/t = (1.332/f) - 0.0024 \qquad \text{[Expression 2]}$$

As disclosed in JP-A-2006-340023 or JP-A-2008-306594, it is known that a flexure vibration component is suppressed when both the end edge of the thick portion 14 and the end edge of the excitation electrode 22 are located at the valley of a waveform of flexure vibration (flexure displacement). Then, if a dimension for matching the end edge of the thick portion 14 or the end edge of the excitation electrode 22 with the position of the valley of the flexure displacement is expressed on the basis of the relationship with the waveform λ of flexure vibration, Expression 3 is obtained. From FIG. 2, the long side length of the excitation electrode 22 is set to Ex (mm) and the long side length of the thick portion 14 is set to Mx (mm).

$$(Mx - Ex)/2 = \lambda/2 \qquad \text{[Expression 3]}$$

Moreover, in the case of the relationship example expressed by Expression 3, it is assumed that the middle position of the thick portion 14 and the middle position of the excitation electrode 22 are equal.

In addition, the relationship between the long side length Mx (mm) of the thick portion 14 and the wavelength λ (mm) may be expressed by Expression 4.

$$Mx/2 = \{(A/2) + (1/4)\}\lambda \text{ (where, A is a positive integer)} \qquad \text{[Expression 4]}$$

In addition, the above relationship expression is based on the assumption that the long side length X (mm) of a quartz crystal plate is sufficiently larger than the thickness t (mm) of the thick portion 14. Specifically, it is preferable to satisfy the relationship of Expression 5.

$$X \geq 20t \qquad \text{[Expression 5]}$$

According to the piezoelectric vibrating element 12 which satisfies the above relationship, the flexure vibration component is suppressed. However, if only such a relationship is satisfied, it is known that the CI value is increased markedly if the digging quantity of the thick portion 14 exceeds a predetermined rate.

Figure 2:
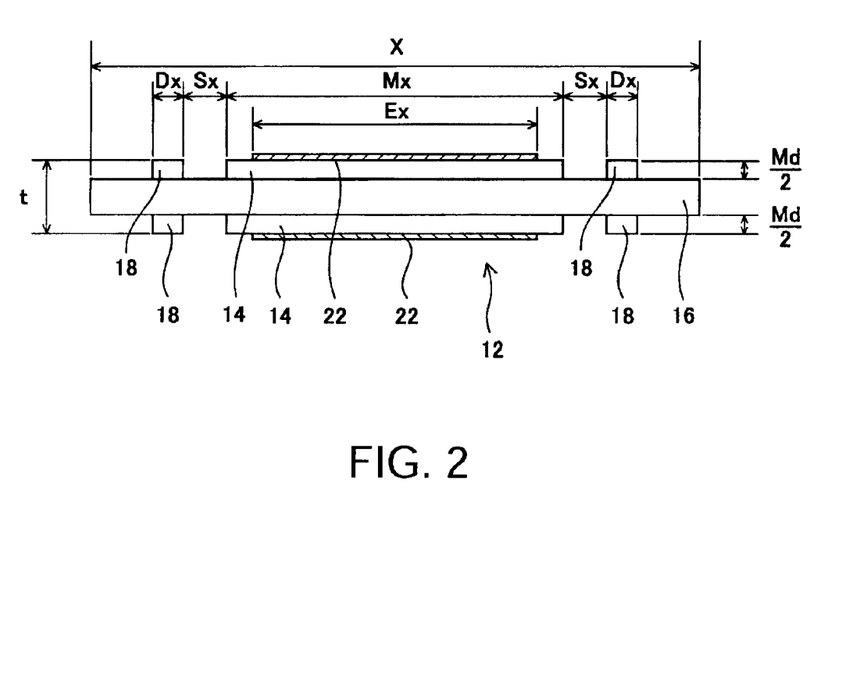
FIG. 2 is a view for defining the size of each portion in a piezoelectric vibrating element in the first embodiment.
Figure 3:
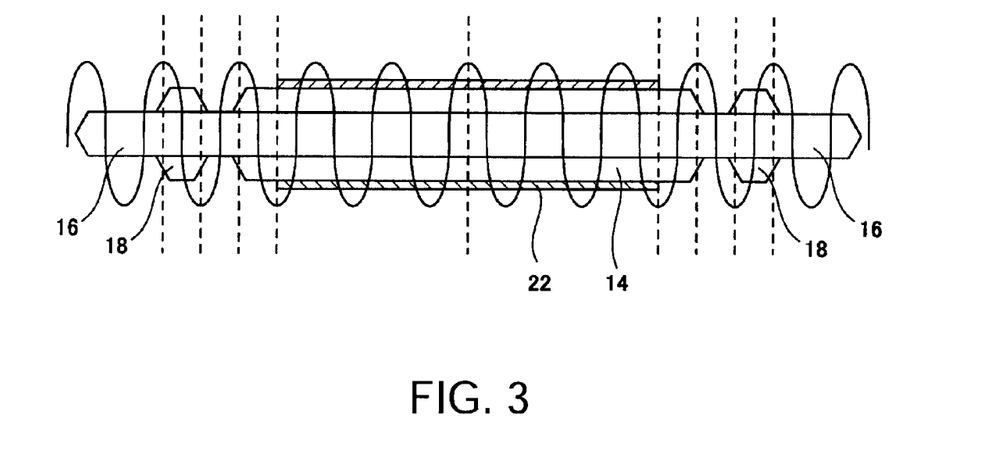
FIG. 3 is a view showing the relationship between each portion of a piezoelectric vibrating element and displacement of flexure vibration.

Therefore, in the present embodiment, the protruding portion 18 is provided in the thin portion 16, and an end edge of the protruding portion 18 is made to match the valley of flexure displacement regarding the relationship between the protruding portion 18 and the flexure vibrations, as shown in FIGS. 2 and 3.

In order to satisfy such a relationship, it is preferable to calculate the length Dx (mm) of the protruding portion 18 in the X-axis direction and the distance Sx (mm) from the end edge of the thick portion 14 to the end edge of the protruding portion 18 on the basis of the relationship with the wavelength λ of the flexure displacement and to satisfy this relationship.

The length Dx (mm) of the protruding portion 18 in the X-axis direction calculated as described above may be expressed by Expression 6.

$$Dx = (\lambda/2) \times m \text{ (where, m is a positive integer)} \qquad \text{[Expression 6]}$$

In addition, the distance Sx (mm) from the end edge of the thick portion 14 to the end edge of the protruding portion 18 in the piezoelectric vibrating element 12 may be expressed by Expression 7.

$$Sx = (\lambda/2) \times n \pm 0.1\lambda \text{ (where, n is a positive integer)} \qquad \text{[Expression 7]}$$

By satisfying all of such relationships, all of the end edge of the thick portion 14, the end edge of the excitation electrode 22, and the end edge of the protruding portion 18 are located at the valley of flexure displacement. Accordingly, flexure vibration can be suppressed.

Figure 4:
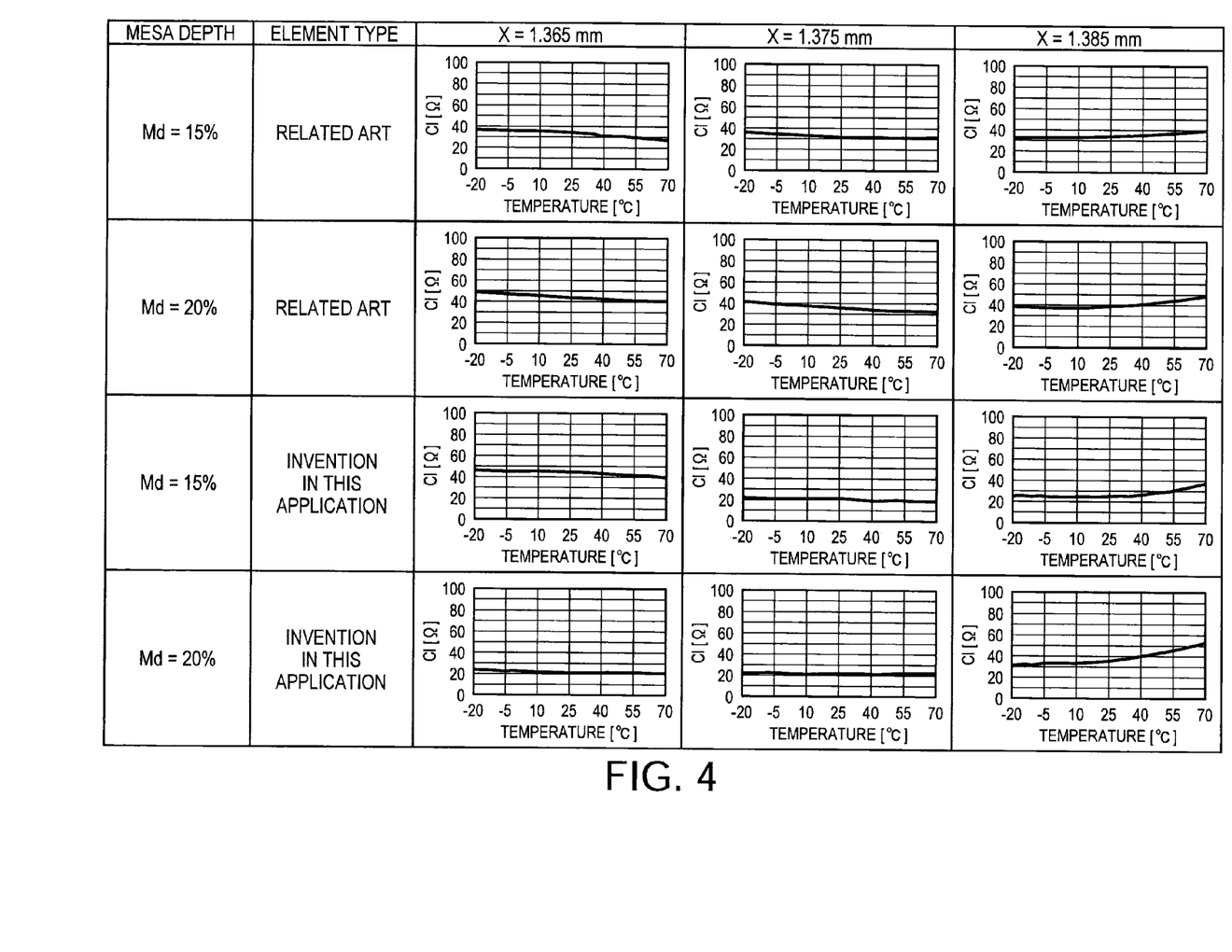
FIG. 4 is a graph showing the relationship between a change in the rate of mesa digging quantity and a change in the CI value.

In addition, an increase in the CI value when setting the height (digging quantity) of the thick portion 14 to be large can be suppressed by adopting such a configuration. FIG. 4 shows changes of the CI value with a difference in the rate of digging quantity (Md) in a mesa type piezoelectric resonator (related art), in which a protruding portion is not provided and the end edge of a thick portion and the end edge of an excitation electrode are matched with a valley of flexure displacement, and a mesa type piezoelectric resonator with a protruding portion according to the present embodiment (invention of this application). Referring to FIG. 4, if the known structure and the invention of this application are compared for the same Md, it can be seen that the CI value tends to decrease by providing the protruding portion and it is most effective when the length of a long side of a piezoelectric plate is set to X=1.375 mm.

As can be seen from FIG. 4, in the piezoelectric resonator according to the known technique, it can be checked that the CI value increases if Md increases from 15% (rate with respect to the thickness t) to 20% for all sizes (X size). On the other hand, in the piezoelectric vibrating element 12 of the invention of this application, it can be seen that if the value of Md increases from 15% to 20%, there is almost no increase in the CI value compared with the case of Md=15% (in the case of X=1.375 mm), and the CI value slightly increases compared with the case of Md=15% (in the case of X=1.385 mm). However, there is a condition in which the CI value is further reduced (in the case of X=1.365 mm).

Thus, according to the piezoelectric resonator 10 of the present embodiment which adopts the piezoelectric vibrating element 12 that satisfies the above configuration, an increase in the CI value can be suppressed even if the rate (Md) of digging quantity of the thick portion 14 is set to be large. For this reason, mass production of a piezoelectric resonator with a rate of digging quantity capable of obtaining a desired CI value becomes possible without taking into consideration an increase in the CI value caused by overetching.

Here, if shaping of a quartz crystal plate is performed by wet etching (hereinafter, simply called etching), the sectional surface may be inclined due to anisotropy of the quartz crystal direction. In the case of an AT-cut quartz crystal plate used in the present embodiment, a stepped portion between the thick portion 14 and the thin portion 16 becomes an inclined surface as shown in FIG. 3. In the present embodiment, however, the midpoint of an inclined surface generated due to the anisotropy of the quartz crystal direction is set as an end edge, and this portion is formed so as to match the valley of flexure displacement. Thus, it is possible to realize a piezoelectric resonator with good CI characteristics.

Figure 5A:
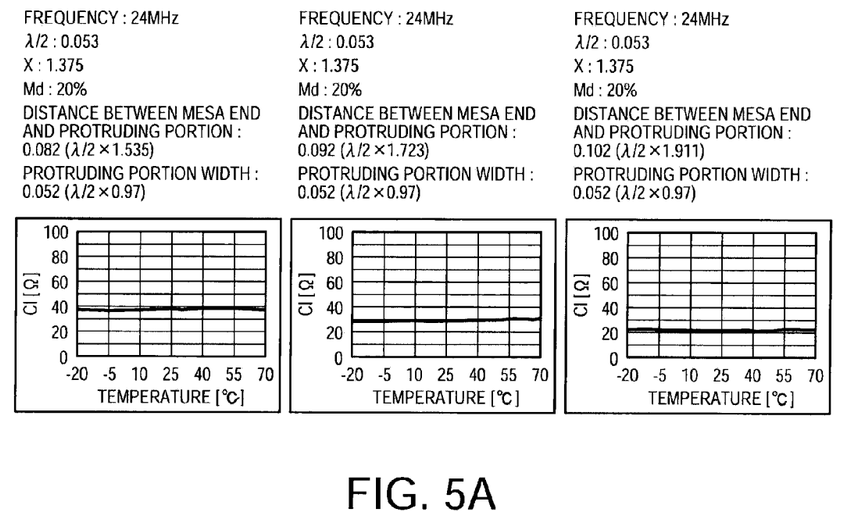
FIGS. 5A and 5B are views for explaining an increase in the CI value according to a change in the distance between a vibrating portion and a protruding portion and the allowable range.

Moreover, in the piezoelectric vibrating element 12 according to the present embodiment, it is possible to have an allowance of about ±0.1λ in the arrangement relationship of the thick portion 14 and the protruding portion 18. This can be understood from the evaluation results of CI characteristics shown in FIGS. 5A and 5B. Specifically, as shown in FIG. 5A, if the distance between the thick portion 14 and the protruding portion 18 is changed, the CI value increases by about 10Ω as the distance between the thick portion 14 and the protruding portion 18 changes by 10 μm. In the piezoelectric resonator exemplified in FIG. 5A, the frequency f is set to 24 MHz, the X size is set to 1.375 mm, Md is set to 20%, and the wavelength λ of flexure vibration is set to about 107 μm. In addition, the graph on the right side having a value between the mesa end and the protruding portion, which indicates the distance from the thick portion 14 to the protruding portion 18 and which is a value closest to twice the value of protruding portion width Dx indicating the width of the protruding portion 18, is set as a reference graph in FIG. 5A.

If the right graph in FIG. 5A is used as a reference, the CI value when the value (distance between the mesa end and the protruding portion) of Sx has changed by 10 μm is better than the CI value (refer to FIG. 4) of a piezoelectric resonator in the known structure, and there is an increase in the CI value when the amount of change is 20 μm. Accordingly, it could be seen that the amount of change of 10 μm was a substantially allowable range.

Figure 5B:
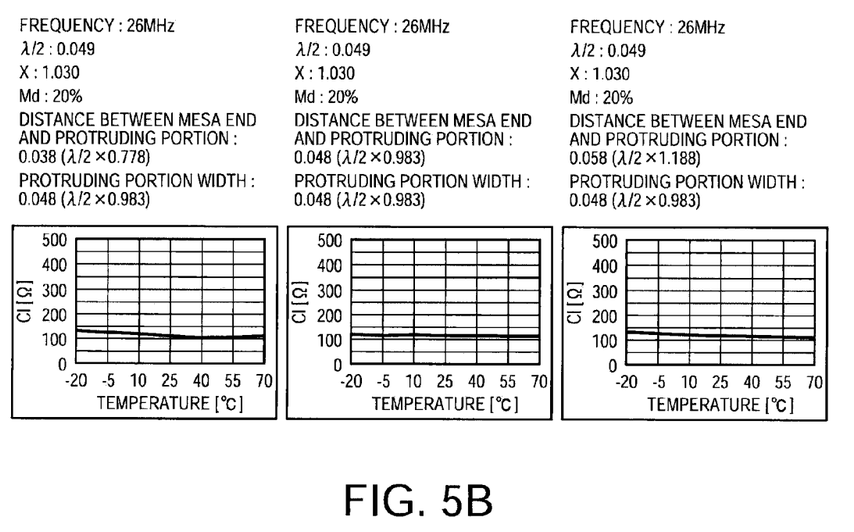

Moreover, regarding a piezoelectric resonator in which the frequency f is set to 26 MHz, an increase in the CI value is not observed even if the position of a protruding portion changes by 10 μm, as shown in FIG. 5B. Moreover, in FIG. 5B, the middle graph in which the distance between the mesa end and the protruding portion is equal to the value of the protruding portion width is set as a reference. In addition, the wavelength λ of flexure vibration is about 98 μm.

Based on such simulation evaluation, it is thought that the value of Sx hardly affects an increase in the CI value even if an error of about ±10 μm occurs in the piezoelectric resonator according to the present embodiment. In the present embodiment, therefore, the allowance of Sx was set to ±10 μm. In addition, since the wavelength λ of flexure displacement in the piezoelectric resonator of f=24 MHz is about 107 μm and the wavelength λ of flexure displacement in the piezoelectric resonator of f=26 MHz is about 98 μm, Expression 8 is satisfied assuming that the wavelength of flexure displacement in these piezoelectric resonators is about 100 μm.

$$\pm 10\ (\mu m) = \pm 0.1\lambda \qquad \text{[Expression 8]}$$

From this, in Expression 7, the allowance is expressed by the relationship with the wavelength λ.

Next, a package which forms a piezoelectric resonator includes a package base and a lid. A package base 32 shown in FIGS. 1A and 1B has a rectangular box shape and includes an internal mounting terminal 38 on the internal bottom surface and an external terminal 40 on the external bottom surface. In addition, the internal mounting terminal 38 and the external mounting terminal 40 are electrically connected to each other through a circuit pattern (not shown).

The piezoelectric vibrating element 12 is mounted in the package base 32 using a bonding material 42, such as a conductive adhesive. In the mounting process, the bonding material is applied on the internal mounting terminal 38 of the package base 32, and the piezoelectric vibrating element 12 is mounted such that an I/O electrode is located on the applied bonding material 42.

As shown in FIGS. 1A and 1B, when the boxed-shaped package base 32 is adopted, a so-called lid which has a flat plate shape is adopted as a lid 34. The lid 34 is bonded to the package base 32 through a seam ring 36 as a soldering material.

The piezoelectric resonator 10 with such a configuration is manufactured through the following processes.

First, a corrosion-resistant film is formed on an AT cut or BT cut quartz crystal plate. Then, a resist film is formed to cover the corrosion-resistant film, and patterning processing for removing the resist film excluding the thick portion 14 and the protruding portion 18 is performed. The corrosion-resistant film is etched using the patterned resist film as a mask, and then the quartz crystal plate is etched using the resist film and the corrosion-resistant film as a mask.

In addition, since the digging quantity of quartz crystal by etching and the angle of the quartz crystal face formed by anisotropy of the quartz crystal direction are known, patterning of the resist film at the time of etching is performed in consideration thereof.

The resist film and the corrosion-resistant film are peeled off from the quartz crystal plate for which the appearance formation using etching has ended, and a metal film for forming the excitation electrode 22, the input/output electrode 26, and the lead-out electrode 24 is formed. Forming a metal film is preferably performed by vapor deposition, sputtering, and the like.

After forming the metal film, the metal film is covered with a resist film and the resist film is patterned according to the shapes of the excitation electrode 22, the input/output electrode 26, and the lead-out electrode 24. After patterning the resist film, the electrode film 20 is formed by etching the metal film using the patterned resist film as a mask. As a result, the piezoelectric vibrating element 12 is obtained.

Then, the resist film is peeled off, and the piezoelectric vibrating element 12 is mounted in the package base 32 formed separately. After mounting the piezoelectric vibrating element 12 in the package base 32, an opening of the package base 32 is sealed with the lid 34. Thus, the piezoelectric resonator 10 is formed.

The piezoelectric resonator 10 with such a configuration has high productivity and can suppress an increase in the CI value even if the digging quantity of a mesa portion (thick portion 14) is set to be larger than that in the related art.

Therefore, the rate Md of digging quantity can be set to the appropriate value, at which the CI value is satisfactory, regardless of overetching.

Moreover, in the embodiment described above, the package 30 which forms the piezoelectric resonator 10 is formed by the box-shaped package base 32 and the flat-plate-shaped lid 34. However, the piezoelectric resonator 10 according to the embodiment of the invention may have a package base with a flat plate shape and a so-called capped lid with a box shape.

Figure 6A:
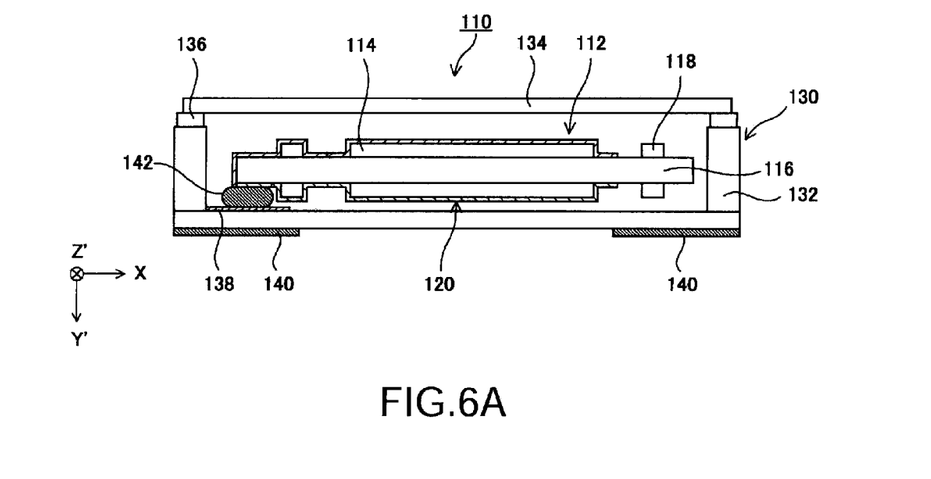
FIGS. 6A and 6B are views showing the configuration of a piezoelectric resonator according to a second embodiment.
Figure 6B:
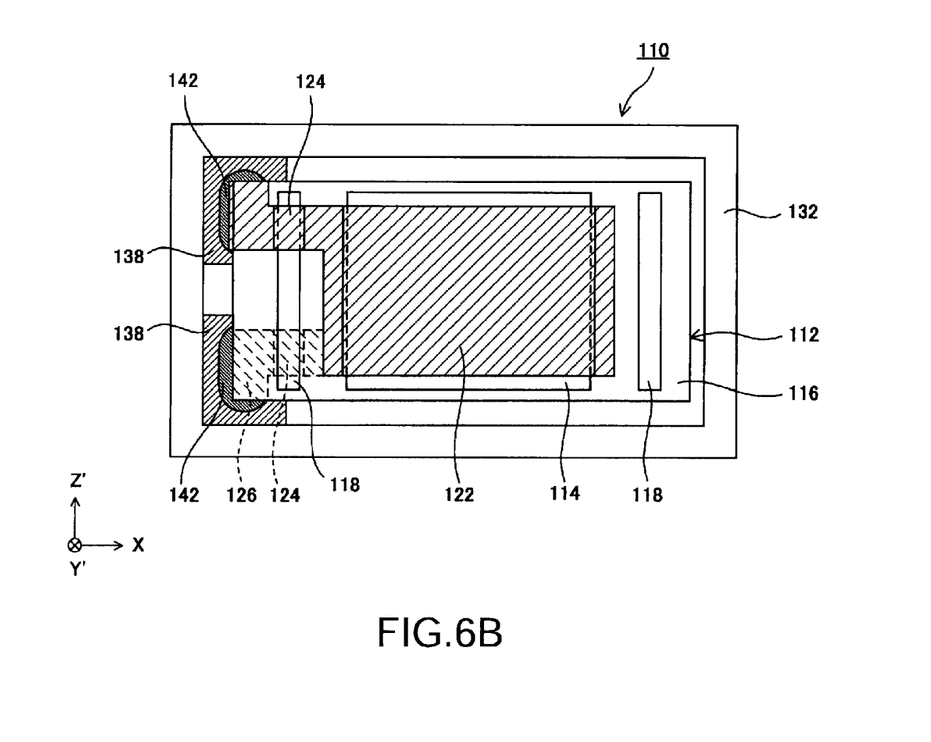

Next, a piezoelectric resonator according to a second embodiment of the invention will be described in detail with reference to FIGS. 6A and 6B. In addition, most of the configuration of the piezoelectric resonator according to the present embodiment is the same as the piezoelectric resonator according to the first embodiment described above. Accordingly, the same components as in the first embodiment are denoted by reference numerals obtained by adding 100 to reference numerals in the drawings in the first embodiment and a detailed explanation thereof will be omitted. In addition, FIG. 6A is a view showing the configuration of a mesa type piezoelectric resonator when viewed from the front side, and FIG. 6B is a view showing the planar configuration in a state where a lid is removed.

In a piezoelectric resonator 110 according to the present embodiment, an excitation electrode 122 is provided to extend up to a thin portion 116 which is located on the extending line of the long side of the thick portion 114 (in the displacement direction of principal vibration).

Figure 7:
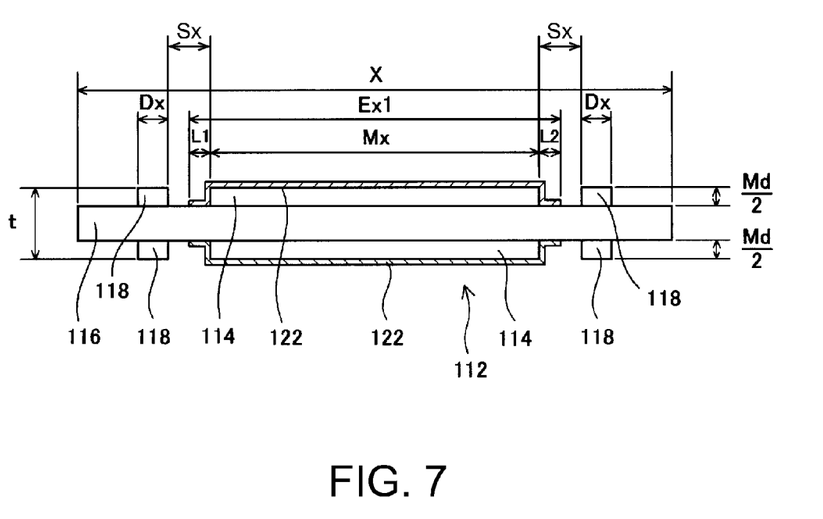
FIG. 7 is a view for defining the size of each portion in a piezoelectric vibrating element in the second embodiment.

In the present embodiment, the relationship of long side length Mx of the thick portion 114, long side length Ex1 of an excitation electrode, and a waveform λ of flexure displacement may be set as follows (refer to FIG. 7). First, the long side length Mx of the thick portion 114 is assumed to satisfy the relationship of Expression 4.

Next, the relationship between the long side length of the thick portion 114 and the long side length Ex1 of the excitation electrode 122 is assumed to satisfy Expression 9.

$$Ex1=Mx+(L1+L2) \quad \text{[Expression 9]}$$

Here, end edges of L1 and L2, which are relevant to end edges of the excitation electrode, need to be matched to the valley of flexure displacement as also described in the first embodiment. Accordingly, the end edges of L1 and L2 are set to satisfy the relationship of Expressions 10, 11, and 12.

$$L1=(\lambda/2)\times p \text{ (where, } p \text{ is a positive integer)} \quad \text{[Expression 10]}$$

$$L2=(\lambda/2)\times q \text{ (where, } q \text{ is a positive integer)} \quad \text{[Expression 11]}$$

$$L2-L1=r\times\lambda \text{ (where, } r \text{ is an integer)} \quad \text{[Expression 12]}$$

Regarding the relationship between a protruding portion 118 and the end edge of the excitation electrode 122, the end edge of the protruding portion 118 and the end edge of the excitation electrode 122 may be matched by setting the relationship of L1≦Sx and L2≦Sx.

Figure 8:
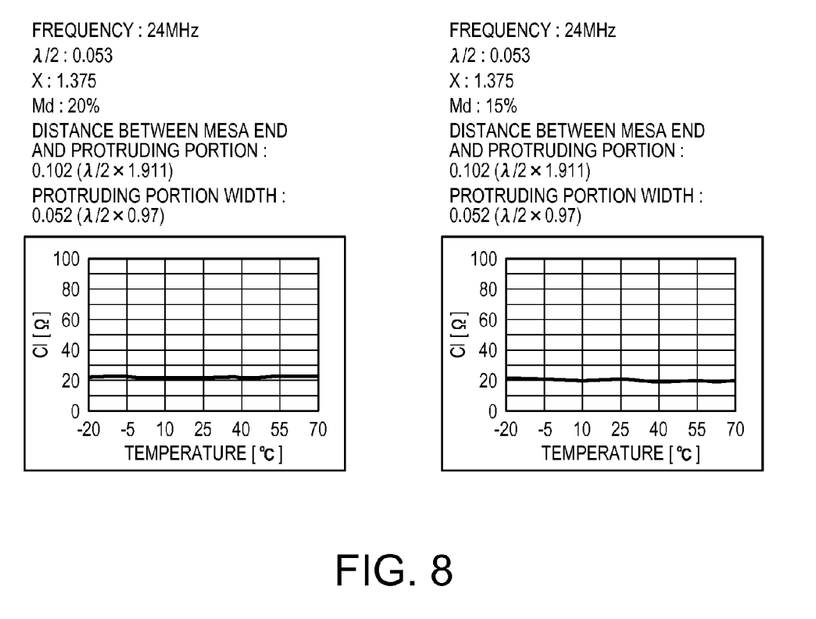
FIG. 8 is a graph showing a simulation for proving the effect in the piezoelectric resonator according to the second embodiment.

In the piezoelectric resonator 110 of the present embodiment which satisfies such relationships, most deterioration (increase) of the CI value can be suppressed even if the rate Md of the digging quantity of the thick portion 114 is increased, as shown in FIG. 8. Thus, also when such a configuration is adopted, the same effects as in the piezoelectric resonator 10 according to the first embodiment can be obtained.

Figure 9:
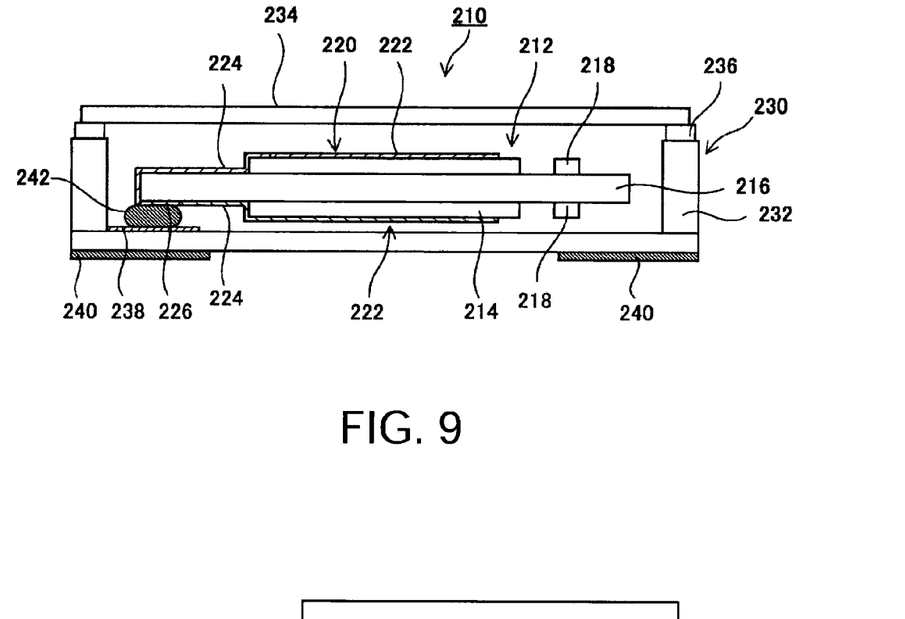
FIG. 9 is a view showing the configuration of a piezoelectric resonator according to a third embodiment.

Next, a piezoelectric resonator according to a third embodiment of the invention will be described in detail with reference to FIG. 9. In addition, most of the configuration of the piezoelectric resonator according to the present embodiment is the same as the piezoelectric resonator according to the first embodiment described above. Accordingly, the same components as in the first embodiment are denoted by reference numerals obtained by adding 200 to reference numerals in the drawings in the first embodiment and a detailed explanation thereof will be omitted.

In a piezoelectric resonator 210 according to the present embodiment, a protruding portion 218, which is provided in a thin portion 216, is only an end (distal side end) of the other side of the thin portion 216. Also when such a configuration is adopted, end edges of a thick portion 214, an excitation electrode 222, and the protruding portion 218 are formed so as to be located at the valley of flexure displacement.

Figure 10:
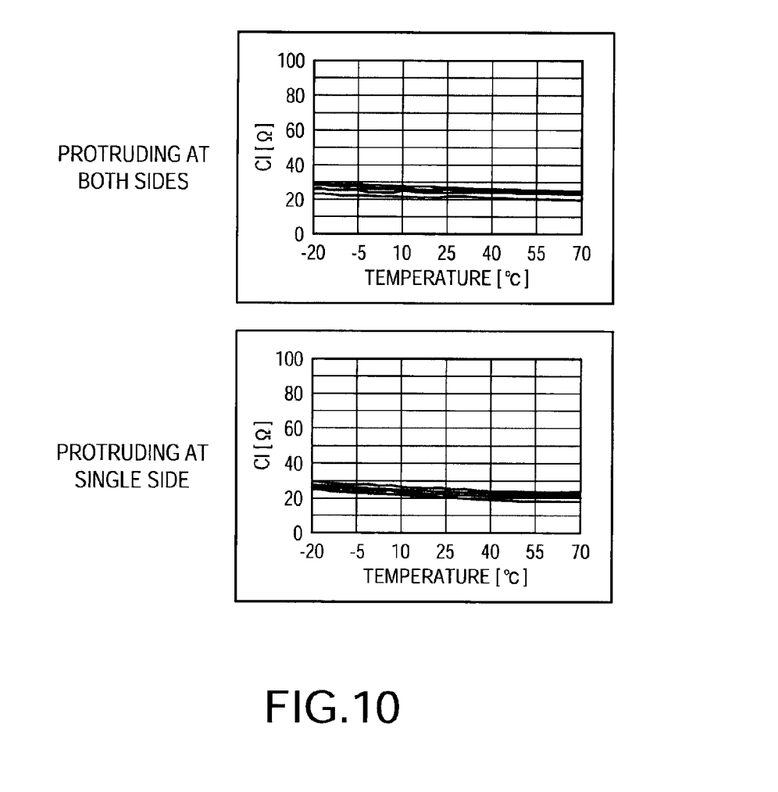
FIG. 10 is a graph showing a simulation for proving the effect in the piezoelectric resonator according to the third embodiment.

In the case of adopting such a configuration, whether or not there is an influence on an increase in the CI value when increasing the rate Md of digging quantity of the thick portion 214 becomes a problem due to providing the protruding portion 218, which is disposed with the thick portion 214 interposed therebetween, at only the distal side end. Then, simulation of the CI value change according to a change of the rate Md of digging quantity by the piezoelectric resonator, which has the piezoelectric vibrating element according to the embodiment of the invention mounted under the same conditions other than a protruding portion provided at the base side end, is shown in FIG. 10. In FIG. 10, the graph titled "protruding at both sides" shows a change in the CI value of the piezoelectric resonator 10 according to the first embodiment, and the graph titled "protruding at a single side" shows a change in the CI value of the piezoelectric resonator 210 according to the present embodiment.

As is apparent from FIG. 10, also when the protruding portion 218 is provided at only one side, the same effects as in the piezoelectric resonator according to the first embodiment can be obtained. Therefore, the piezoelectric resonator 210 with such a configuration can also be made as a part of the invention.

The entire disclosure of Japanese Patent Application No. 2009-246902, filed Oct. 27, 2009 is expressly incorporated by reference herein.

What is claimed is:

1. A piezoelectric resonator comprising:
    a piezoelectric plate in which thickness-shear vibration is principal vibration and which has a vibrating portion that is surrounded by a peripheral portion and has a larger thickness than the peripheral portion; and
    an excitation electrode disposed on a principal surface of the piezoelectric plate,
    wherein both a long side of the vibrating portion and a long side of the excitation electrode are parallel to a long side of the piezoelectric plate,
    assuming that a long side length of the piezoelectric plate is X, a thickness of the vibrating portion is t, a long side length of the vibrating portion is Mx, a long side length of the excitation electrode is Ex, and a wavelength of flexure vibrations occurring in a longitudinal direction of the piezoelectric plate is λ, the relationship of λ/2= (1.332/f)−0.0024 (where, f is a resonance frequency of a piezoelectric resonator), (Mx−Ex)/2=λ/2, Mx/2={(A/2+(1/4)}λ (where, A is a positive integer), and X≧20t is satisfied,
    a protruding portion, which is disposed on an extension line of the vibrating portion in the longitudinal direction so as to be parallel to a short side direction of the vibrating portion, is provided, assuming that a length of the protruding portion in the displacement direction of the principal vibration is Dx, the relationship of Dx=($\lambda$/2)×m (where, m is a positive integer) is satisfied, and assuming that the distance between the vibrating portion and the protruding portion is Sx, the relationship of Sx=($\lambda$/2)×n±0.1$\lambda$ (where, n is a positive integer) is satisfied.

2. The piezoelectric resonator according to claim 1, wherein the excitation electrode is provided to extend from a principal surface of the vibrating portion to the peripheral portion located between the protruding portions, and a distance L1 from the vibrating portion to an end edge of the excitation electrode, which is provided to extend up to the peripheral portion, satisfies the relationship of L1=($\lambda$/2)×p (where, p is a positive integer).

3. The piezoelectric resonator according to claim 1, wherein the piezoelectric plate is a quartz crystal plate, a stepped portion between the vibrating portion and the peripheral portion and a stepped portion between the peripheral portion and the protruding portion each have inclined surfaces, and a size of the vibrating portion, a distance from the vibrating portion to the protruding portion, and a size of the protruding portion are set with the middle of the inclined surface as a reference.

4. The piezoelectric resonator according to claim 1, wherein the protruding portion is provided at only one end side of the vibrating portion in the longitudinal direction.

5. The piezoelectric resonator according to claim 1, wherein a short side length of the protruding portion is set to be equal to a short side length of the vibrating portion.

6. The piezoelectric resonator according to claim 1, wherein a height of the vibrating portion and a height of the protruding portion from the peripheral portion as a reference are equal.

* * * * *